United States Patent
Kitamura et al.

(10) Patent No.: US 6,662,351 B2
(45) Date of Patent: Dec. 9, 2003

(54) WIRING EDITING METHOD, FOR SEMICONDUCTOR PACKAGE, CAPABLE OF EASILY EDITING OFFSET OF WIRING PATTERN

(75) Inventors: Tamotsu Kitamura, Nagano (JP); Takahide Ichimura, Nagano (JP); Hiroyuki Sakai, Nagano (JP); Takayuki Nagasaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/949,698

(22) Filed: Sep. 10, 2001

(65) Prior Publication Data

US 2002/0035720 A1 Mar. 21, 2002

(30) Foreign Application Priority Data

Sep. 19, 2000 (JP) .......................... 2000-283262

(51) Int. Cl.[7] ............................................... G06F 17/50
(52) U.S. Cl. ............................. 716/11; 716/12; 716/9; 438/612; 438/6
(58) Field of Search ..................... 716/1–14; 438/612, 438/6

(56) References Cited

U.S. PATENT DOCUMENTS

| | | | |
|---|---|---|---|
| 6,121,063 A | * | 9/2000 | Liu et al. .................... 438/15 |
| 6,226,560 B1 | | 5/2001 | Hama et al. ................... 716/1 |
| 6,298,473 B1 | * | 10/2001 | Ono et al. ................... 439/404 |
| 2002/0028573 A1 | * | 3/2002 | Kitamura et al. ........... 438/612 |

FOREIGN PATENT DOCUMENTS

JP  10-214898 A  8/1998

* cited by examiner

*Primary Examiner*—Vuthe Siek
*Assistant Examiner*—Sun James Lin
(74) *Attorney, Agent, or Firm*—Paul & Paul

(57) ABSTRACT

A wiring editing method for a semiconductor package of this invention includes the steps of assuming virtual circular arcs R1 to R4 in consideration of a clearance around a predetermined via 11*a* in a designated area on a virtual plane, drawing a regular polygon 12 circumscribing each of the virtual circular arcs R1 to R4, drawing a tangent from a via 11 crossed by one of the virtual circular arcs R1 to R4 to the crossing virtual circular arc and connecting to the regular polygon 12 circumscribing the crossing virtual circular arc to thereby form a wiring pattern 13 and moving or omitting redundant line segments forming the regular polygon 12 in the wiring pattern 13 to change a wiring route when an offset occurs in the wiring pattern 13 passing between the vias 11 inside the designated area.

2 Claims, 5 Drawing Sheets

WIRING EDITING METHOD, FOR SEMICONDUCTOR PACKAGE, CAPABLE OF EASILY EDITING OFFSET OF WIRING PATTERN

BACKGROUND OF THE INVENTION

1. Field of the Invention

This invention relates to a wiring editing method, for a semiconductor package and using a CAD system, for correcting the offset of a wiring pattern passing between vias by arranging a pad to be connected to a semiconductor chip, and vias around the pad, on a virtual plane and describing a wiring pattern for connecting the pad and the vias.

2. Description of the Related Art

When wiring patterns of a semiconductor package such as a PBGA (Plastic Ball Grid Array) or an EBGA (Enhanced Ball Grid Array) are designed by use of a CAD system, design is done so that pads (such as wire bonding pads) electrically connected to electrode terminals (called "chip pads") of the semiconductor chip and vias (lands) disposed round the former can be connected, or the vias can be connected with one another, on the virtual plane.

An ordinary procedure of designing wiring for a semiconductor package will be explained.

Wiring design is done for each layer when a substrate (circuit board) of a semiconductor package has single-layered wiring or multi-layered wiring. More concretely, the procedure is explained as follows.

First, a designer determines an outline of a semiconductor package and the arrangement of solder balls to serve as connection terminals on a virtual plane by use of the CAD system.

Next, an outline of a die pad for mounting the semiconductor chip is formed, and the bonding pads are arranged around the die pad in an arbitrary shape such as a linear shape, a zigzag shape or a circular arc shape.

The bonding pads and the chip pads of the semiconductor chip are connected. (This connection includes not only wire-bonding connection but also flip-chip connection).

Wiring is then done, while a wiring route is determined, lead wires from the bonding pads to the other bonding pads, from via-hole plating portions to the other via-hole plating portions and from the bonding pads to the via-hole plating portions cross one another. At this time, lines and spaces between the via-hole plating portions are calculated and the wiring route is so decided as to satisfy a design rule. Wiring is done from all the bonding pads. A re-design of the wiring is sometimes necessary so as to correct offset of wiring and the via positions.

A so-called "Even Space Method" is a method that was developed to efficiently produce a wiring design for a semiconductor package. This method conducts automatic wiring by means of circular arcs and line segments on a virtual plane by use of the CAD system, and then increases the width of the line segments or makes uniform the wiring gaps (lines and spaces) between the vias, to a certain extent.

According to this method, concentric circles are equidistantly drawn around a via, for example, and a tangent is drawn between specific concentric circles to automatically determine the wiring route between the adjacent vias. Thereafter, an offset of the wiring, and its concentration, resulting from this automatic wiring are corrected.

Even though the designer corrects the wiring gap and offset of the positions of the vias (lands) after provisionally wiring the bonding pads and the vias (lands), changes to the wiring positions are substantially difficult because the positions of the vias cannot be changed unconditionally. The design itself must be reduce once again in some cases.

Simultaneous decision of the wiring route, simultaneously with checking as to whether or not the wiring gap is in conformity with the design rule, renders the system more complicated. In this case, the system cannot be easily expanded or changed, and a satisfactory wiring result cannot be obtained easily.

The Even Spaced method is relatively effective when the vias (lands) formed on the substrate of the semiconductor package are formed regularly and equidistantly. In practice, however, they are formed in an irregular arrangement. Particularly when an excessive space is formed around a via, wiring becomes redundant or an offset is likely to occur in the wiring.

In this case, it becomes necessary to increase the radii of the concentric circles of the vias, at which the gaps between lead wires are small, for re-wiring, or to cut the circular arc and to again join the lead wires, or to move the lead wires. Such a correction step causes much trouble, cannot reflect the merit of automatic wiring and is likely to wrongly connect the lead wires.

When a large number of circular arcs are used, the editing on the CAD system requires a long time. When the wiring gaps are small, for example, it is necessary to increase the radii of the concentric circles of the vias for re-wiring, or to cut the circular arc and to again join the lead wires, or to move the lead wires. When the correction width is not uniform, the correction step is time-consuming, the merit of automatic wiring cannot be reflected, and a mistake in the wiring is likely to occur.

When a photo etching mask is directly produced on the basis of the circular arc, the processing time becomes twice or three times longer than that of the line segment.

It is an object of the present invention to provide a wiring editing method for a semiconductor package that solves the problems of the prior art technologies described above, forms each wiring pattern passing between vias as line segments and thus can easily edit an offset in the wiring pattern.

SUMMARY OF THE INVENTION

To accomplish the object described above, the present invention employs the following means.

Namely, the present invention provides a wiring editing method for a semiconductor package, using a CAD system, by arranging pads connected to a semiconductor chip and vias around the pads on a virtual plane, by drawing a wiring pattern for connecting the pads and the vias and correcting the offset of the wiring pattern passing between the vias, comprising the steps of:

assuming virtual circular arcs, considering the clearance around a predetermined one of the vias, inside a designated area on the virtual plane;

drawing a regular polygon circumscribing each of the virtual circular arcs; and when the virtual circular arcs cross any of the vias, drawing a tangent from the crossed vias to the crossing virtual circular arc and connecting said regular polygon circumscribing the crossing circular arc to form a wiring pattern.

The wiring editing method of the present invention is also characterized in that each side of the regular polygon crosses at a right angle, a line segment connecting the via positioned at the center of the virtual circular arcs and each of the vias arranged around the center via part.

BRIEF DESCRIPTION OF THE DRAWINGS

The present invention will be more clearly understood from the description, as set below, with reference to the accompanying drawings, wherein.

DESCRIPTION OF THE PREFERRED EMBODIMENTS

Before proceeding to a detailed description of the preferred embodiment, a prior art will be described with reference to the accompanying drawings to clarify the differences between the prior art and the present invention.

Figure 6:
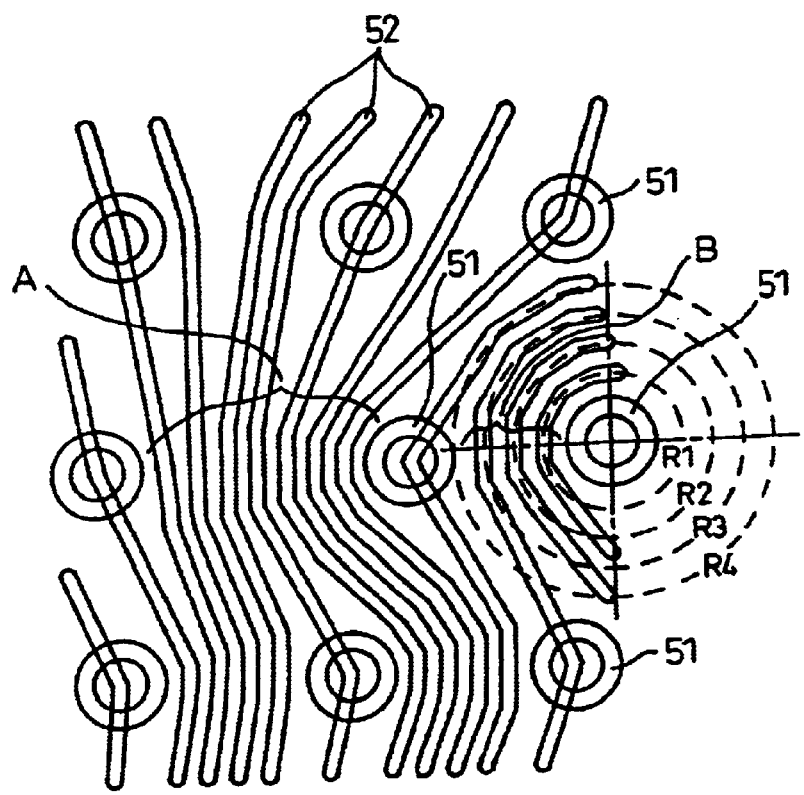
FIG. 6 is an explanatory view showing a conventional formation method of a wiring pattern.

One of the conventional technologies developed for efficiently executing wiring design for a semiconductor package is the Even Space Method. This method is conducted in the following way. First, automatic wiring is conducted in a CAD system by use of circular arcs and line segments on a virtual plane as shown in FIG. 6. The width of the line segments is then increased or a wiring gap between vias is corrected to a certain uniform extent.

This method describes equally spaced concentric circles R1 to R4 around vias (lands) 51, then draws a tangent between a specific concentric circle or from the via 51 to a part between concentric circles at which lead wires do not cross one another (between the via 51 and the concentric circle R3 and between the via 51 and the concentric circle R4 in FIG. 6, for example), and automatically decides a wiring pattern 52 between the vias 51. The offset and the concentration of wiring that occur as a result of this automatic wiring are later corrected. As shown in FIG. 6, the wiring pattern 52 generates an offset in the lines and spaces in an area A and an area B.

The even space method described above provides good wiring efficiency and is relatively effective when the vias (lands) 51 are formed regularly and equidistantly. In practice, however, the formation of vias (lands) 51 varies from semiconductor package to semiconductor package. Moreover, since the vias (lands) 51 are so arranged as to avoid the positions of gates for resin molding, they take an irregular form in many cases.

Particularly when an excessive space is formed round each via (land) 51, wiring tends to become redundant or unbalanced as shown in FIG. 6, so that the electric resistance becomes large or an offset is likely to occur in the wiring route. In addition, the balance is not good from the aspect of appearance, either.

When a large number of circular arcs are used, an editing on the CAD system requires an extended time. When a wiring gap is narrow, for instance, it becomes necessary to increase the radii of the concentric circles of the via and to do the wiring again, or to cut the circular arcs and to join the lead wires together, or to move the lead wires. When the corrected width is not uniform, the correction step requires more time and causes trouble with the result that the merit of automatic wiring cannot be exploited and a mistake in the wiring is likely to occur.

When a mask is directly produced on the basis of the circular arc, the processing time becomes two to three times as long in comparison with that of the line segment.

It is an object of the present invention to provide a wiring editing method for a semiconductor package capable of easily editing an offset of a wiring pattern by forming a wiring pattern passing between vias by use of line segments.

Hereinafter, a preferred embodiment of the present invention will be explained in detail with reference to the accompanying drawings.

In this embodiment, an explanation will be given of an editing method when die pads for mounting a semiconductor chip, bonding pads connected by wire bonding to electrode terminals (that is, chip pads) of the semiconductor chip and vias (lands) around the bonding pads are virtually arranged in an outer shape of the semiconductor package drawn on a virtual plane by a CAD system, and wiring patterns for connecting the bonding pads and the vias are automatically arranged.

Incidentally, since each via is often formed immediately above a land, the term "via" in this embodiment represents also the position of a land. In the case of multi-layered wiring, similar means is employed to connect one via to another and to connect a via to a land, depending on the layers.

Figure 1:
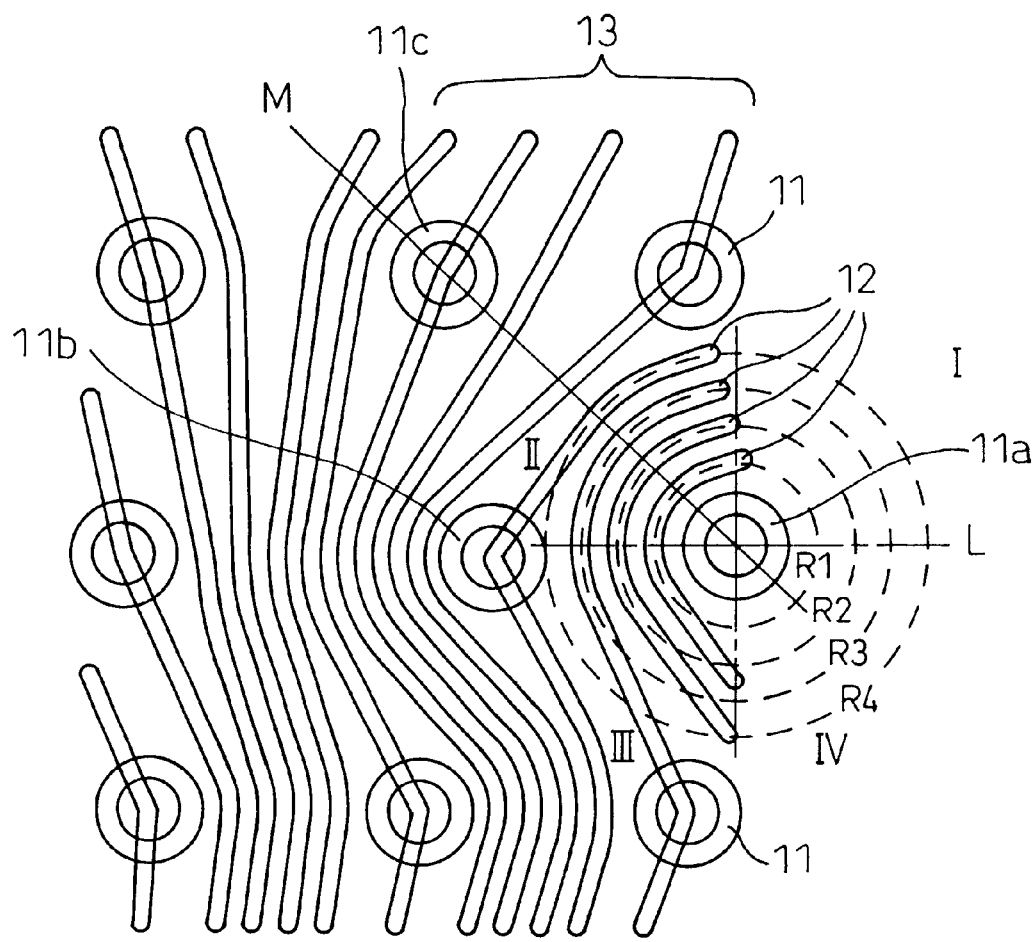
FIG. 1 is an explanatory view showing a formation method of a wiring pattern.
Figure 2:
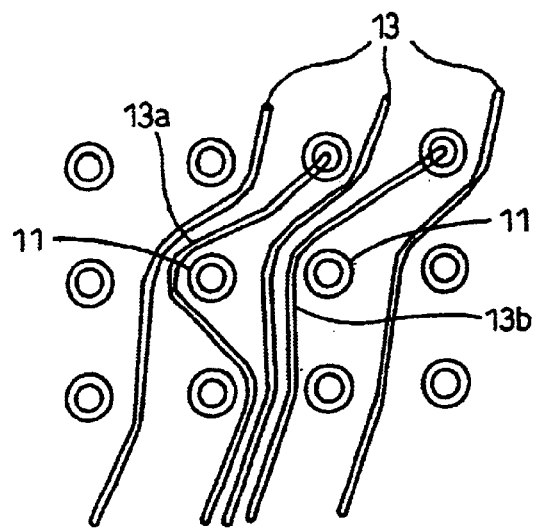
FIG. 2 is an explanatory view showing the state where offset occurs in the wiring pattern.
Figure 3:
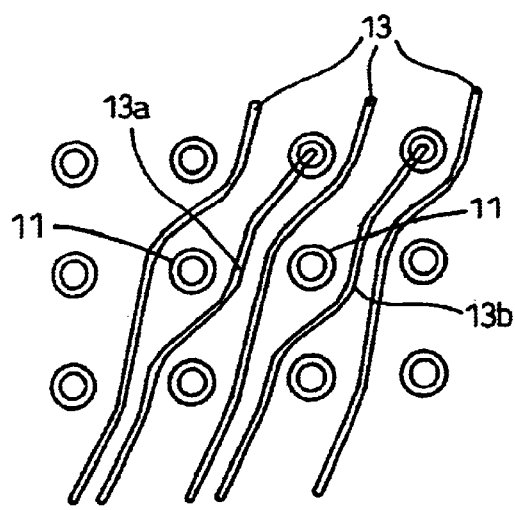
FIG. 3 is an explanatory view after the wiring pattern shown in FIG. 2 is edited.
Figure 4:
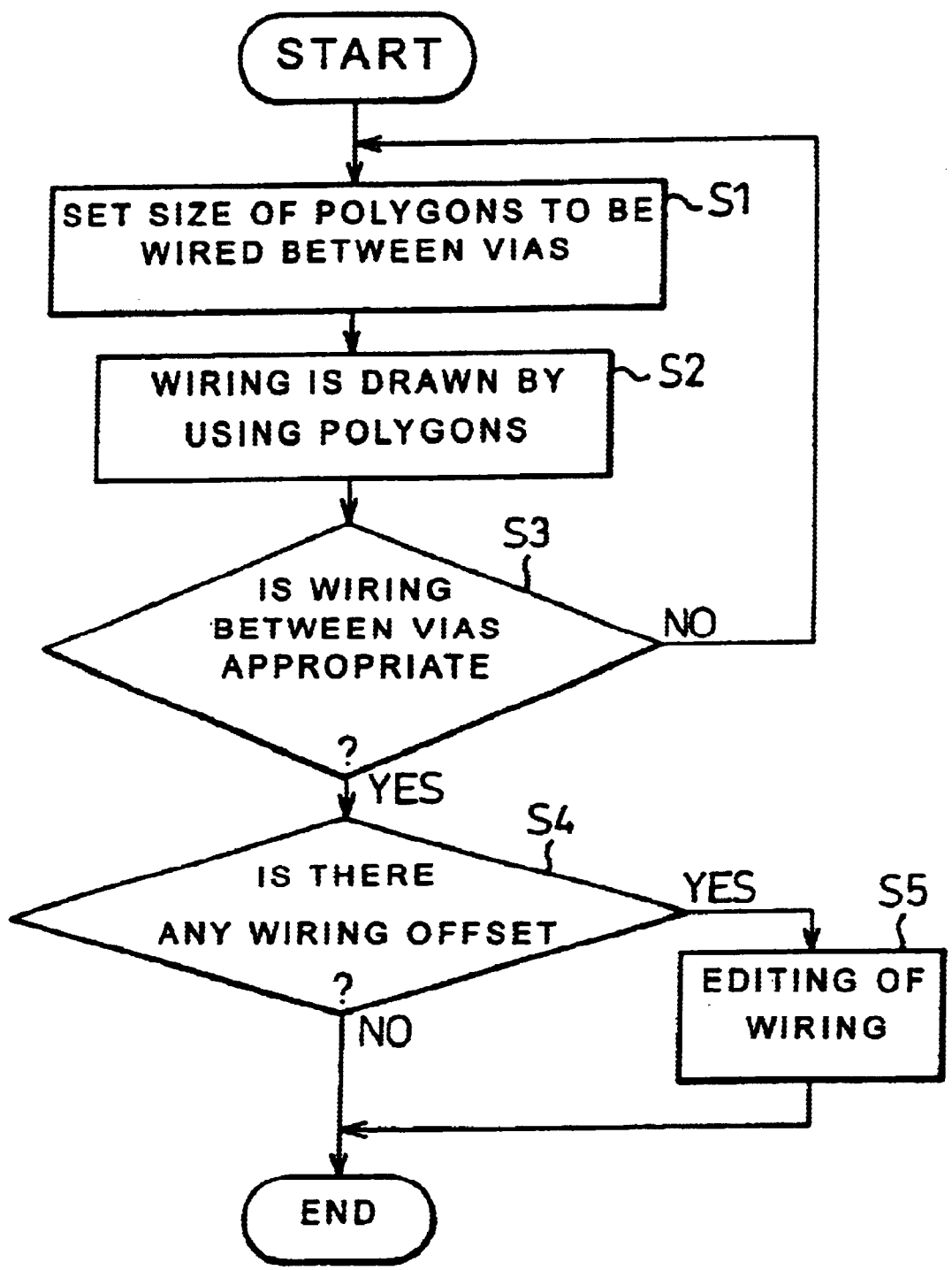
FIG. 4 is a flowchart showing a procedure of a wiring edition method.
Figure 5:
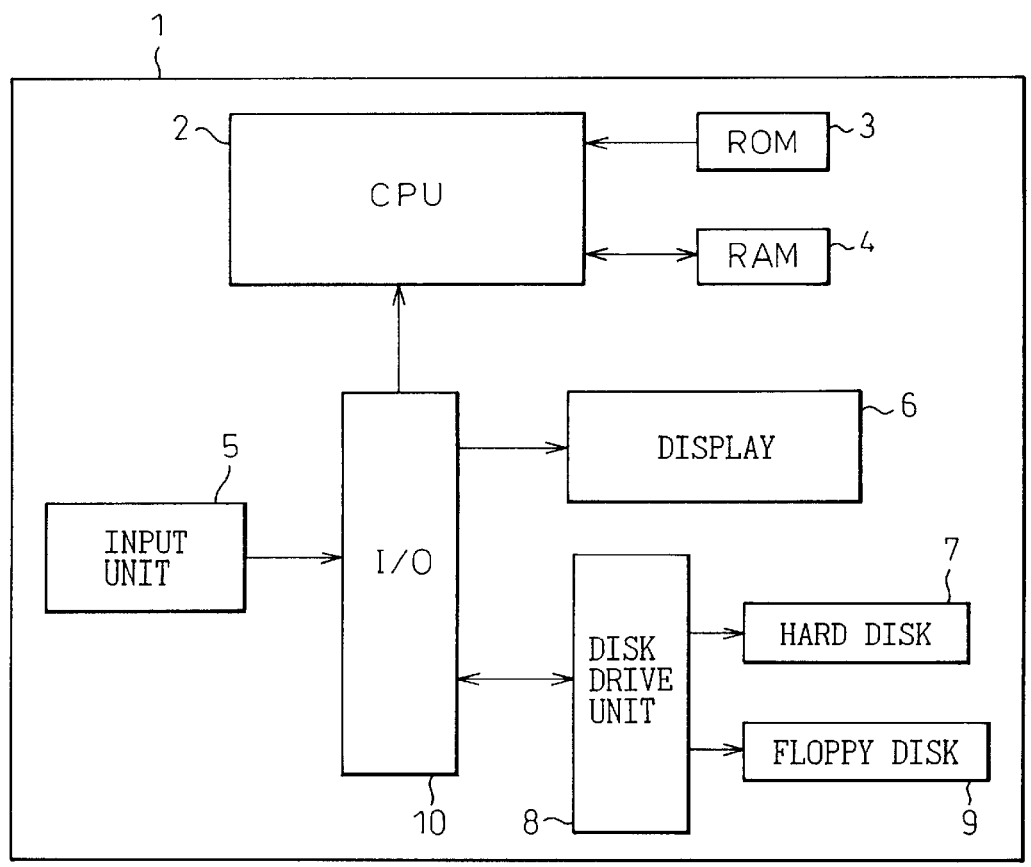
FIG. 5 is a block diagram showing a construction of a CAD system.

FIG. 1 is an explanatory view of forming a wiring pattern and FIG. 2 is an explanatory view showing the state where an offset occurs in the wiring pattern. FIG. 3 is an explanatory view after the wiring pattern shown in FIG. 2 is edited, FIG. 4 is a flowchart showing the procedure of the wiring editing method and FIG. 5 is a block diagram of a CAD system.

Initially, a schematic construction of the CAD system for designing wiring of a semiconductor package will be explained with reference to the block diagram of FIG. 5.

Reference numeral 1 denotes the CAD system. The CAD system has the following construction.

Reference numeral 2 denotes a CPU as a control unit. The CPU 2 transmits an instruction to each part of the CAD system 1 in accordance with the input information, and controls the operation of the overall system.

Reference numeral 3 denotes a ROM. The ROM 3 stores an operating program for the CAD system 1.

Reference numeral 4 denotes a RAM. The RAM 4 temporarily stores various data, or is used as a work area by the CPU 2.

Reference numeral 5 denotes an input unit. The input unit 5 includes a keyboard, a mouse, etc, and is used for inputting various input data such as the kind of line, coordinate data, the wiring width, the wiring gap (clearance), and so forth.

Reference numeral 6 denotes a display. The display 6 displays design data of a package.

Reference numeral 7 denotes a hard disk. The hard disk stores and manages wiring design data of each layer for each file.

Reference numeral 8 denotes a disk drive unit. The disk drive unit 8 drives the built-in hard disk 7 and also drives external storage media such as a floppy disk (FD) 9.

Reference numeral 10 denotes an input/output interface (I/O). The I/O interface 10 is used for exchanging instructions and data among units such as between the CPU 2 and the input unit 5. The disk drive unit 8 for the hard disk and for the floppy disk may be connected to the I/O interface 10, and a printer, too, may be connected.

The CPU 2 reads out the operating program stored in the ROM 3 to the RAM 4, executes wiring design on a virtual plane in accordance with the input information inputted from the input unit 5, and displays the result on the display 6. The wiring design data is stored in the hard disk 7 or the floppy disk 9.

First, a designer determines an outer shape of a semiconductor package by using the CAD system 1, and provisionally decides the positions of lands (vias) at which connection terminals are to be formed.

Next, the designer forms the outer shape of the die pad to which the semiconductor chip is mounted, and then provisionally arranges a plurality of bonding pads, around the die pad, into an arbitrary shape such as a linear shape, a zigzag shape, a circular arc shape, and so forth.

The bonding pads and a chip pad are then connected to one another.

The bonding pads and the vias (lands) are provisionally connected in such a fashion that the lead wires do not cross one another. A wiring pattern is then formed.

Subsequently, the present invention is practiced.

The wiring editing method for a semiconductor package according to the present invention will be explained on the basis of the flowchart in FIG. 4 and also with reference to FIGS. 1 to 3.

In Step 1 in FIG. 4, the size of a regular polygon between the vias 11 is decided on the basis of virtual circular arcs R1 to R4. The virtual circular arcs R1 to R4 are determined in consideration of the clearance between the predetermined adjacent vias 11 inside a designated region on the virtual plane (see FIG. 1).

In the next step S2, a regular polygon 12 is drawn. This regular polygon 12 is one that circumscribes one of the virtual circular arcs R1 to R4 drawn in such a fashion that the side, passing between the via 11a positioned at the center of the virtual circular arcs R1 to R4 and the via 11b positioned adjacent to this via 11a, crosses at right angles the line segment L that connects the via 11a and the via 11b. The reason why the regular polygon 12 is drawn in such a fashion that one of its sides crosses at right angles the line segment L is because an offset of the wiring does not easily develop even under the severe condition where the clearance between the via 11a and the via 11b is small, and lines and spaces can be designed.

The regular polygon 12 is preferably a regular 8n polygon (n: natural number) because such a polygon can satisfy the condition that one of the sides thereof crosses, at right angles, the line segment L connecting the via 11a and the via 11b, and because eight vias 11 are generally arranged in such a fashion as to encompass via 11a.

When a sufficient clearance can be secured with respect to the via 11b disposed adjacent to the via 11a positioned at the center of the virtual circular arcs R1 to R4, the regular polygons 12 are formed in such a fashion as to circumscribe the virtual circular arcs R1 to R4 that are assumed, in consideration of the clearance with respect to the via 11c, on the line segment M in FIG. 1 passing through the via 11a at the center in FIG. 1. This is because no offset exists around the via 11a at the center and wiring can be made most uniformly. The regular polygon 12 is formed in a predetermined area to match the direction of wiring (wiring is formed from the II quadrant to the III quadrant in the embodiment shown in FIG. 1), and each side is replaced by a straight line defined by the center angle of each virtual circular arc R1 to R4 and by the radius of the circular arc, and is connected.

Referring to FIG. 1, when the virtual circular arcs R1 to R4 cross any of the vias 11, a tangent is drawn from the crossing via 11 to the virtual circular arcs R1 to R4 and is interconnected to a predetermined side of the regular polygon (refer to the interconnection between the via 11 and the virtual circular arc R3 and between the via 11b and the virtual circular arc R4 in FIG. 1). The wiring pattern 13 is automatically generated in this way.

In step S3, whether or not wiring passing between the vias 11 is suitably wired to match with the design rule is determined. When this wiring is not judged as being suitable, the flow again returns to step S1, and the size of the regular polygon 12, that is, the lines and spaces of the virtual circular arc, is again set. Thereafter, similar steps are repeated and the wiring pattern 13 is again generated. When the wiring is judged to be suitable, the flow proceeds to step S4.

As a result of automatic wiring described above, an offset of wiring and a concentration occur in some cases. Therefore, in step S4, whether or not an offset, of wiring passing between the vias 11, occurs in a designated area is judged. If no offset of wiring exists, the wiring editing work is completed.

When an offset of the wiring pattern 13 occurs as shown in FIG. 2, editing is executed to correct the offset of wiring in step S5. In other words, in the wiring pattern 13 in which the offset occurs, the line segment or segments forming the regular polygon 12 are moved or deleted and the wiring route is changed. As a concrete example, the wiring patterns 13a and 13b in FIG. 2 are moved to the opposite side of the via 11 to correct the wiring route as shown in FIG. 3.

The above explains the wiring editing method of the designated area designated by the designer on the virtual plane. When the arithmetic processing for drawing the circumscribing regular polygon has a sufficient margin, however, the designated area may be expanded to the whole layer. When a plurality of layers exists, wiring editing is conducted for each layer, so that wiring editing of the semiconductor package is conducted as a whole.

The wiring edition method of the semiconductor package described above uses the regular polygon 12 circumscribing each of the virtual circular arcs R1 to R4 assumed to have the via 11 as the center, and can automatically wire the wiring pattern 13 passing between the vias 11 by use of only the line segments. Therefore, this method can improve wiring efficiency. Even when an offset of the wiring occurs due to automatic wiring, this method can conduct, extremely easily and quickly, correction work for the wiring route inclusive of movement/omission of the line segments, and can improve the efficiency of wiring design.

Though the present invention has been described for the preferred embodiment, the present invention is in no way limited thereto but can be changed or modified in various ways without departing from the scope thereof. For instance, when a sufficient clearance can be secured between the vias, the wiring pattern passing between the via positioned at the center of the regular polygon and the vias on both side of the center via, that is, the side of the regular polygon, need not always cross, at right angles, the line segment L connecting the vias. Though the foregoing embodiment deals with the case where the semiconductor chip is connected by wire bonding to the substrate, flip-chip-connection may be employed, too.

The wiring editing method for the semiconductor package according to the present invention uses a regular polygon circumscribing each of the virtual circular arcs assumed to have a predetermined via as the center, can automatically wire the wiring pattern passing between the vias by using only the line segment, and can therefore improve wiring efficiency. Even when an offset occurs due to automatic wiring, the wiring editing method of the present invention can correct, extremely easily and quickly, the wiring route, inclusive of movement and omission of a line segment, and can accomplish efficient wiring design.

What is claimed is:

1. A wiring editing method for a semiconductor package, using a CAD system, arranging pads connected to a semiconductor chip, and vias around said pads, on a virtual plane, drawing a wiring pattern for connection said pads and said vias and correcting an offset of said wiring pattern passing between said parts vias, comprising the steps of:

assuming virtual circular arcs, by considering a clearance around a predetermined one of said vias, inside a designated area on said virtual plane;

drawing a regular polygon circumscribing each of said virtual circular arcs; and when said virtual circular arcs cross any of the vias, drawing a tangent from the crossed via to said crossing virtual circular arc and connecting said regular polygon circumscribing said crossing circular arc to form a wiring patterns; and executing correction, inclusive of movement or omission line segments forming said regular polygon among said wiring pattern, to thereby change a wiring route when an offset occurs in said wiring pattern passing between said vias inside said designated area.

2. A wiring editing method of a semiconductor package, according to claim 1 wherein each side of said regular polygon crosses, at a right angle, a line segment connecting said via positioned at the center of said virtual circular arcs and each of said vias arranged around said center via.

* * * * *